United States Patent [19]
Bertagnolli et al.

[11] Patent Number: 4,889,823
[45] Date of Patent: Dec. 26, 1989

[54] BIPOLAR TRANSISTOR STRUCTURE FOR VERY HIGH SPEED CIRCUITS AND METHOD FOR THE MANUFACTURE THEREOF

[75] Inventors: Emmerich Bertagnolli; Peter Weger, both of Munich, Fed. Rep. of Germany

[73] Assignee: Siemens Aktiengesellschaft, Berlin and Munich, Fed. Rep. of Germany

[21] Appl. No.: 358,672

[22] Filed: May 30, 1989

Related U.S. Application Data
[62] Division of Ser. No. 19,368, Feb. 26, 1987, abandoned.

[30] Foreign Application Priority Data
Mar. 21, 1986 [DE] Fed. Rep. of Germany ....... 3609721

[51] Int. Cl.⁴ .......................................... H01L 21/265
[52] U.S. Cl. ..................................... 437/31; 437/162;
437/228; 437/233; 437/193; 437/158;
148/DIG. 11; 148/DIG. 124; 357/34; 156/653
[58] Field of Search ................. 437/31, 32, 33, 162, 437/228, 193, 191, 233, 186, 158, 160

[56] References Cited
U.S. PATENT DOCUMENTS
| | | |
|---|---|---|
| 4,190,466 | 2/1980 | Bhattacharyya et al. |
| 4,481,706 | 11/1984 | Roche |
| 4,483,726 | 11/1984 | Isaac ................................ 437/31 |
| 4,495,010 | 1/1985 | Kranzer ............................ 437/31 |
| 4,581,319 | 4/1986 | Wieder et al. |
| 4,712,125 | 12/1987 | Bhatia et al. |

FOREIGN PATENT DOCUMENTS
| | | |
|---|---|---|
| 0002670 | 7/1979 | European Pat. Off. |
| 0071494 | 2/1983 | European Pat. Off. |
| 0142632 | 5/1985 | European Pat. Off. |
| 0145927 | 6/1985 | European Pat. Off. |
| 3242059 | 5/1984 | Fed. Rep. of Germany |
| 59-34660 | 2/1984 | Japan |
| 02798177 | 11/1988 | Japan ............................ 437/31 |

OTHER PUBLICATIONS
"High-Density, High-Performance Bipolar Technology," Jambotkar, IBM Technical Disclosure Bulletin, vol. 23, No. 12, May 1981.

Primary Examiner—Brian E. Hearn
Assistant Examiner—Kevin McAndrews
Attorney, Agent, or Firm—Hill, Van Santen, Steadman & Simpson

[57] ABSTRACT

A bipolar transistor structure wherein the emitter zone is produced by outward diffusion from etching residues which are formed by deposition of conductive material and re-etching, with the etching residues forming part of the emitter terminal region. In addition to individual transistors, pairs of transistors having coupled emitters can also be produced and employed in hig precision differential amplifiers. Memory cells can also be produced which have low surface requirements, particularly due to the reproduceable attainment of emitter widths below one micron. Since the methods enable the production of completely self-aligned transistors, they can be implemented with straightforward steps which are largely independent of lithography. Emitter widths in the range of about 0.2 to 0.5 microns can be produced.

12 Claims, 5 Drawing Sheets

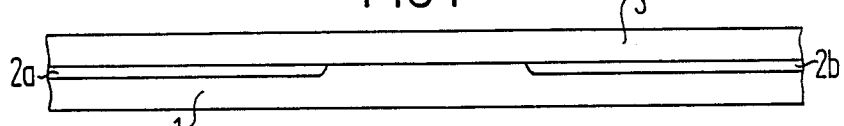
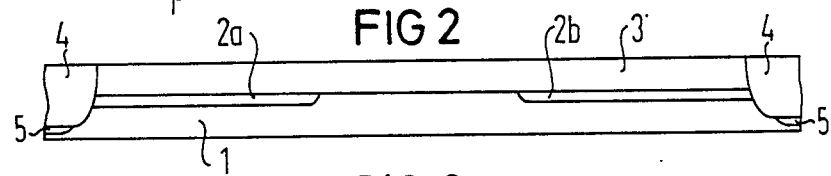
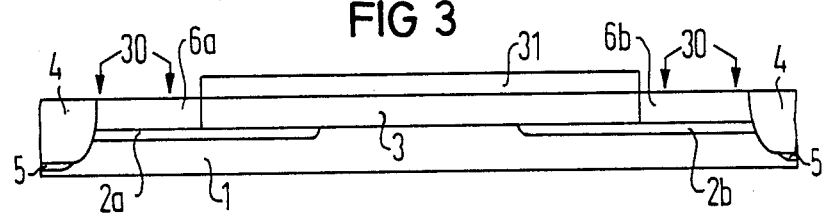
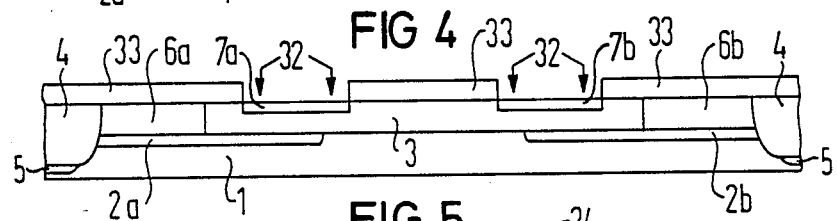
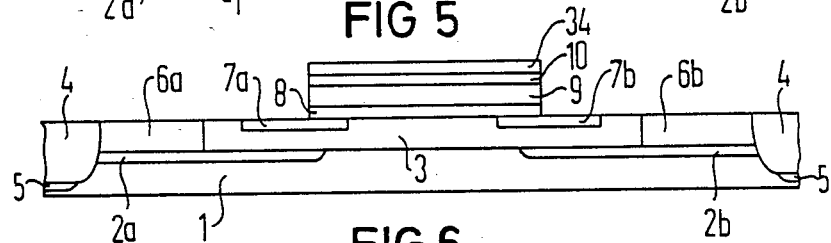
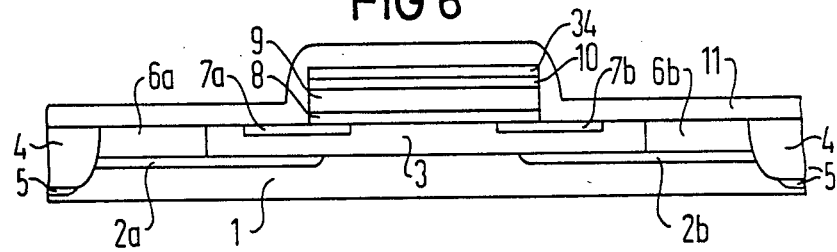

BIPOLAR TRANSISTOR STRUCTURE FOR VERY HIGH SPEED CIRCUITS AND METHOD FOR THE MANUFACTURE THEREOF

This is a division of application Ser. No. 019,368, filed Feb. 26, 1987, now abandoned.

BACKGROUND OF THE INVENTION

1. Field of the Invention

The present invention is directed to a bipolar transistor structure comprising a collector, a base, and an emitter in a silicon semiconductor substrate wherein the emitter zone is formed by outward diffusion from etching residues which have been produced by the deposition of conductive material onto the substrate.

2. Description of the Prior Art

The field of fast integrated circuits required in data technology, consumer electronics and communications technology, such as optical communications transmission, relies heavily upon silicon bipolar transistors.

Developments are underway to achieve higher speeds with a higher degree of integration and smaller dissipated power. There is therefore an existing need for manufacturing methods which are suitable for extremely fast memory, logic and analog circuits.

In addition to the conventional manufacturing technologies which employ adjusted masks, there are a number of methods already existing which contain self-aligning process steps and produce transistors having extremely short switching times.

The digest of technical papers of the 1982 IEEE Solid State Circuits Conference, pages 242–243, discloses a bipolar transistor structure in a report by Tang et al wherein the emitter is manufactured in a self-aligning manner relative to the base contact. The lithography of the transistor structure of 1.25 microns by 2.5 microns occurs by means of electron beam technology. The bipolar transistor structure is employed for emitter-coupled logic circuits. The spacing between emitter and base contacts is about 0.3 microns; the emitter width is at 1.25 microns.

A report by Konaka et al in the Abstracts of the 16th International Conference on Solid State Devices and Materials, 1984, pages 209–212, discloses a self-aligned bipolar transistor structure for high speed circuits, particularly in FIG. 1B wherein emitter widths of 0.35 micron are provided by electron beam lithography. The emitter zone is generated by diffusion outwardly from the emitter zone is generated by diffusion outwardly from the emitter terminal regions.

In a report by Sang-Hun Chai in the Conference Volume of the IEDM 5 disclosures a self-aligning bipolar process wherein the emitter is defined by lithography and the base zone is generated from the base terminal in self-aligning fashion by employing a vertical nitride mask. The spacing between emitter and base (0.2 micron) is determined by the layer thickness of the nitride mask. Extremely low base terminal zones of 0.2 micron are obtained. The emitter areas measure about 1.5 micron by 3.0 micron.

The methods disclosed by this prior art require a substantial investment in lithography and still do not permit emitter widths of less than 1 micron which are needed for very high speed circuits to be consistently reproduced at acceptable yield. In the prior techniques, it was not possible to manufacture largely identical transistor pairs having emitter widths less than 1 micron as required for differential amplifiers having extremely low offsets.

The known methods are accompanied by several serious disadvantages. For one, the minimum widths which were determined by the resolution of the lithography employed was additionally reduced by the internally disposed sidewall insulations or spacers arising during manufacture, as noted by the reports of Tang and Konaka. The fluctuation of the spacer width, ds, which is unavoidable in manufacture, effects a fluctuation of the emitter width by twice as much, 2ds, though the reproduceability thereof decreases greatly with extremely narrow emitters.

Secondly, since the surface of the monocrystalline emitter region was subjected to a plurality of etching steps, the risk of damage was substantial.

Third, for obvious reasons such as mechanical stresses, edge coverage, thermal stresses and the like, the spacer width was limited to various widths below 0.5 microns. Stricter demands must therefore also be met by the lithography for emitter widths below 1 micron so that the methods become extremely costly.

SUMMARY OF THE INVENTION

The present invention provides a method which avoids the above-noted disadvantages and can be used for reproducibly manufacturing a bipolar transistor structure which is completely self-aligned. In addition, transistor pairs having emitter widths below 1 micron and particularly below 0.3 micron, can be produced independently of the lithography employed. This result has not been possible until now.

The objectives of the invention are achieved by a bipolar transistor structure in which the emitter zones are formed by out-diffusion from etching residues which, in turn, have been generated by conforming deposition of conductive materials onto a silicon substrate provided with multiple layer structures of insulation material and conductive material. Re-etching of the conductive layer at the sidewalls of the layer structures results in the etching residues being produced, and these residues are employed as part of the emitter terminal regions.

As used herein, the term "self-aligning" has the same meaning as in the aforementioned articles by Konaka et al. and by Chai.

In one feature of the present invention, the etching residues which are employed as diffusion sources for generating the emitter zones are produced from polysilicon n+ or p+ doping, or from the combination of polysilicon with a metal silicide or from doped silicides of refractory metals or the refractory metals themselves.

It is also within the framework of the invention to manufacture transistor pairs having emitter widths below one micron to internally connect the emitter terminal regions which serve as diffusion sources for generating the emitter zones, connection being by means of a common emitter terminal. Further, there is a possibility of manufacturing bipolar transistor memory cells which have emitter widths below 1 micron, the emitter terminal regions serving as diffusion sources for generating the emitter zones which are internally connected by a common emitter terminal which simultaneously represents the one storage electrode and provides only one insulation ring per memory cell.

BRIEF DESCRIPTION OF THE DRAWINGS

The process steps involved in the manufacture of a bipolar transistor of the present invention for npn transistors will be set forth in greater detail below with reference to a process sequence set forth in FIGS. 1-14. An analogous manufacture of pnp transistors is likewise possible with appropriate changes in the doping.

In the figures, the same reference characters have been used for identical parts.

DESCRIPTION OF THE PREFERRED EMBODIMENTS

Figure 7:
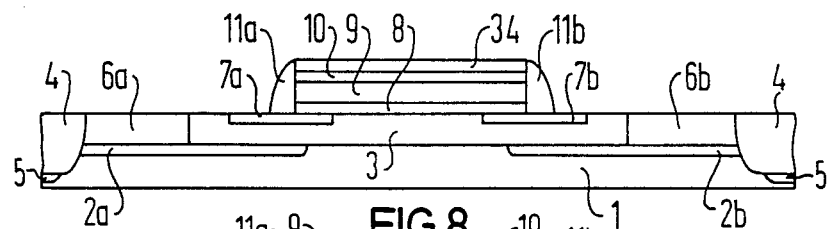

In FIG. 1, there is shown a p-doped monocrystalline silicon substrate 1 in which n-doped zones 2a and 2b which are to be used for the production of the buried collector are formed by means of a masked ion implantation such, for example, as implanting antimony ions with a dosage and energy level of, for example, $3 \times 10^{15}$ cm$^{-2}$, and 80 keV. respectively. This process step can be eliminated and produces the disadvantage of a higher collector resistance. An n$^-$-doped epitaxial silicon layer 3 having a concentration of, for example $1 \times 10^{16}$ arsenic is deposited thereon in a layer thickness of 0.5 to 2 microns.

In FIG. 2, there is illustrated the isolation of the active transistor regions in the semiconductor substrate 1 by providing trenches which are etched and filled up with insulation material composed of SiO$_2$. The trench insulation technique can be the one disclosed in the article by Borland in "Solid State Technology", August 1985, pages 141-148, which article is incorporated herein by reference. Field oxide regions 4 are thus produced. Channel stopper regions 5 for improving the transistor parameters (avoiding a parasitic thick oxide transistor) are thereby produced under the field oxide 4 by means of a an additional boron ion implantation before the trenches are filled. Fundamentally, however, any insulation technique can be employed which isolates the collectors of the individual transistors from one another.

As shown by FIG. 3, the succeeding steps involve manufacturing a low impedance connection 6a, 6b to the buried collector zones 2a, 2b, for the deeply extending collector terminal. This can be accomplished by ion implantation of phosphorous as shown by the arrows 30 using a photoresist mask 31 and subsequent drive-in at a high temperature step. This process step can likewise be eliminated, as set forth in connection with FIG. 1, on the basis of the disadvantage of a high collector resistance.

In FIG. 4, there is shown a base zone 7a and 7b composed of p-doped silicon which is generated by the implantation of boron ions as shown by arrows 32 at a dosage, for example, $1 \times $cm$^{-2}$ and an energy level of 50 keV, using a photoresist mask 33.

The manufacture of a layer sequence is illustrated in FIG. 5. The first insulated layers 8 is composed, for example, of SiO$_2$ over which there is a conductive layer 9 composed, for example, of polysilicon with n+ doping, and a second insulator layer 10 composed, for example, of SiO$_2$. There is an alternative third insulated layer 34 composed of silicon nitride which can be omitted under some circumstances.

The conductive layer 9 forms the later emitter terminal and the insulator layer 34 provides a protective layer. The, four layer sequence of layers 8, 9, 10, and 34 is structured by an anisotropic etching process, such as a dry etching process using reactive ion etching with an etch stop being providing at the last layer 8 on the monocrystalline silicon. The etching is structured by means, for example, of an etching mask so that the layer sequence covers a substrate 1 in the region of the later formed emitter terminal 9.

The step which is crucial to the invention begins with the showing of FIG. 6, namely, generating a narrow emitter zone by deposition of a layer 11 having a good edge-covering effect, being conductive, and being usable as a diffusion source. This layer 11 may be composed, for example, of polysilicon provided with an n+ doping. In the deposition, the layer thickness of the layer 11 is matched to the widths of the desired emitter zone.

In FIG. 7, the layer 11 is shown re-etched throughout its surface by anisotropic etching, such as the dry etching process referred to previously so that only the etching residue 11a, 11b, referred to as "spacers" exist at the sidewalls of the layer sequence structure 8, 9, 10, and 34. The width of the spacers 11a, 11b can be preset by the layer thickness of the layer 11 to determine the emitter width. Since the layer thickness is set exactly and the etching process can be well defined, the method is readily reproducible.

Figure 8:
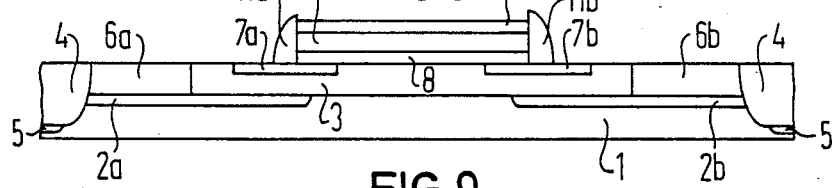

FIG. 8 illustrates the condition after the third insulator layer 34 of silicon nitride has been removed by a wet chemical process.

Figure 9:
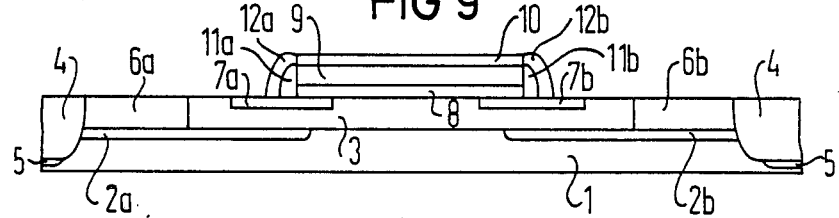

The spacers 11a and 11b are now provided with insulation layer spacers 12a, 12b as shown in FIG. 9. The surface of the n+-doped polysilicon layer structures 11a and 11b and the oxidation and an anisotropic re-etching is carried out example, by dry etching. The widths of the insulation spacers 12a and 12b can, when necessary, be arbitrarily set by an additional insulation spacer (not shown).

Figure 10:

A conductive layer 13 (FIG. 10) which is employed as a diffusion source and is composed, for example, of p+-doped polysilicon or a metal silicide such as tantalum disilicide is first applied to the arrangement provided with the spacers 11a, 11b, 12a, 12b. An insulation layer 14 composed, for example, of SiO$_2$ is then applied.

Figure 11:
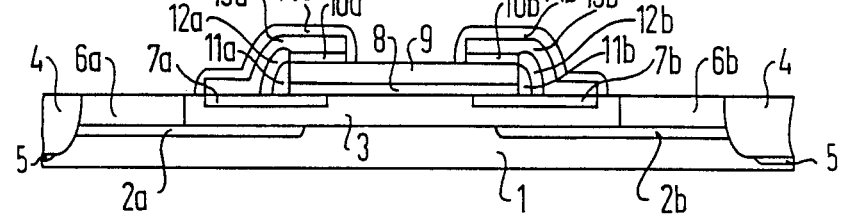

As shown in FIG. 11, the double layer 13, 14 is then structured such as with an anisotropic etching process so that the collector terminal region 6a and 6b, the field oxide regions 4 and the emitter terminal region 9 are exposed. Following this, through surface-wide deposition and re-etching, a spacer is again generated at the sidewalls of the edge structures (10a, 10b, 13a, 13b, 14a, 14b) for the insulation of the layer structures 13a, 13b.

Figure 12:
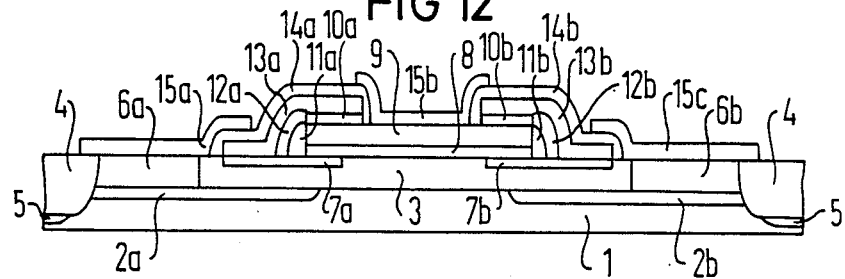
Figure 15:
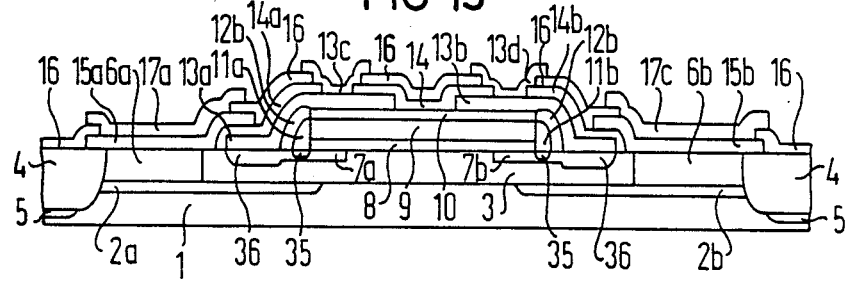
FIG. 15 illustrates a bipolar transistor structure which is modified in contrast to FIGS. 11-14 in that the emitter terminal is conducted laterally outwardly, i.e., in the plane of the drawing and includes upwardly contacted base terminals.

The surface-wide deposition and structuring of an n+ conductive layer 15a, 15b, 15c composed, for example, of tantalum disilicide, then occurs, as illustrated in FIG. 12. The collector terminals 15a and 15c, as well as the emitter terminal 15b are thus formed. The base terminal is directed out toward the side as shown in FIG. 15. At this point, the first metallization may be applied if the appropriate temperature steps which are required for diffusion from the emitter terminal and the base terminal have already been previously carried out.

Figure 13:
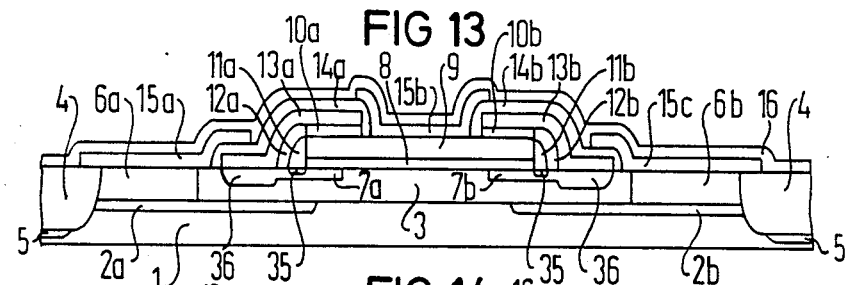

After application of a surface-wide insulation layer 16 composed, for example, of SiO2, there is an activation of the emitter diffusion zone 35 and the base diffusion zone 36 from the etching residues 11a, 11b, and the layer structures 13a, 13b lying directly on the substrate surface. This step is shown in FIG. 13 and takes place at a temperature of, for example, 900° C. to 10000° C. for about 30 minutes.

Figure 14:
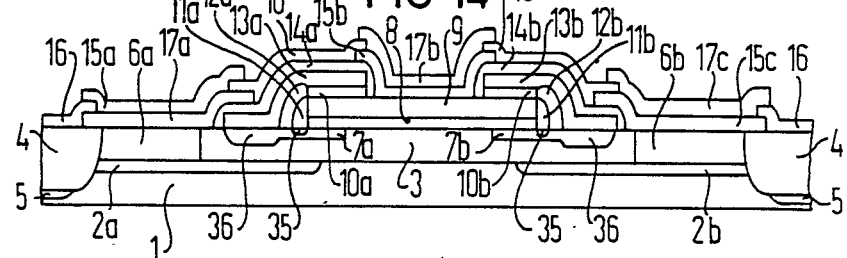

In FIG. 14, there is shown a completely self-adjusted bipolar transistor structure wherein emitter widths in the range from 0.2 to 0.5 micron have been produced and finished by the introduction of contact holes into the insulation 16 followed by a metallization composed of aluminum and structuring of the emitter contact 17b and collector contacts 17a and 17c. The base contact is not visible in FIG. 14.

FIG. 15 shows an alternative form of the bipolar transistor structure of the invention wherein the base terminals (layer 13) are upwardly contacted and the emitter terminal is laterally contacted. Reference number 13c refers to the left-hand base contact and 13a refers to the right-hand base contact.

Figure 16:
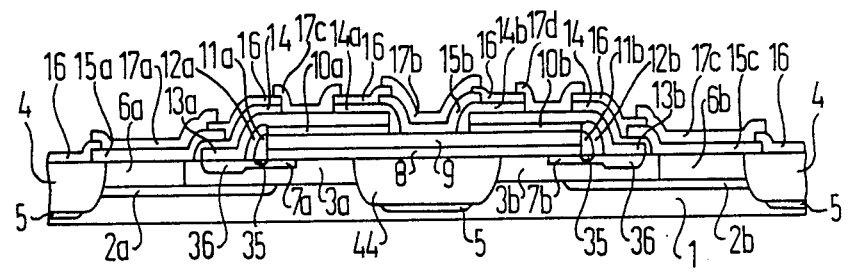
FIG. 16 is a cross-section through a transistor pair of the invention which includes a common emitter terminal.

In FIG. 16, the same reference characters as in FIGS. 1 through 15 apply. Reference numeral 44 refers to the insulation layer separating the two transistors, and being generated in the manufacture of the field oxide regions 4. The structure contains separate collectors 17a, 17c, 17d, and 17e. A common emitter terminal 17b is provided for the transistor pair. The transistor structure illustrated is distinguished in that emitters having widths on the order of 0.30 micron are largely identical and are internally connected to one another by means of the emitter terminal 17b. For most CML logic circuits, this was heretofore possible only with external wiring. The base region and the collector region are manufactured in self-adjusting fashion in this embodiment.

Figure 17:
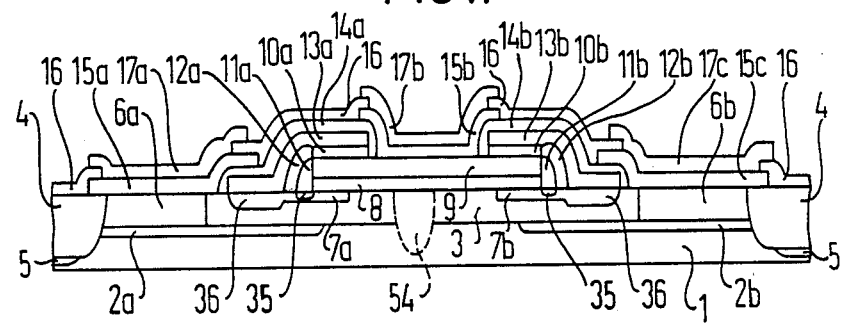
FIG. 17 is a cross-section through a memory cell of the present invention wherein the load resistors and Schottky diodes have been omitted as they do not form part of the present invention.

FIG. 17 illustrates a bipolar memory cell comprising a common emitter 17b and only a single insulation ring 4 per memory cell, thus providing a minimum space requirement. With a high impedance epitaxial layer 3, the insulation between the two collectors 17a and 17c is adequate. In order to reduce or suppress cross-currents, an additional insulation such as a trench insulation layer 54 can be inserted, the trench being produced at the same time as the manufacture of the field oxide regions 4. Further, an emitter contact is eliminated with respect to conventional structures, since both emitters are internally connected.

Figure 18:
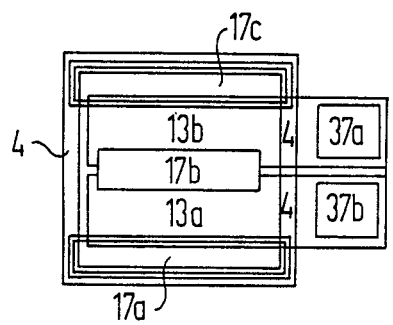
FIGS. 18-21 are plan views of FIGS. 14, 15, 16 and 17, respectively.

In FIG. 18, the individual transistor structure of FIG. 14 is shown in plan view to illustrate the laterally arranged base contact holes 37a and 37b. Otherwise, the same reference characters apply as in FIG. 14.

Figure 19:
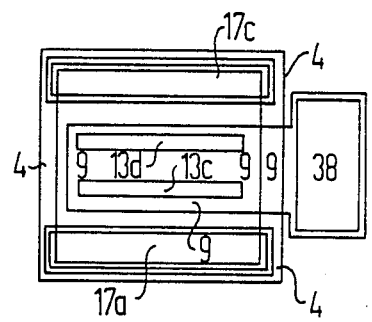

The alternative structure shown in FIG. 15 is shown in plan view in FIG. 19, the emitter terminal being applied by means of a contact hole 38.

Figure 20:
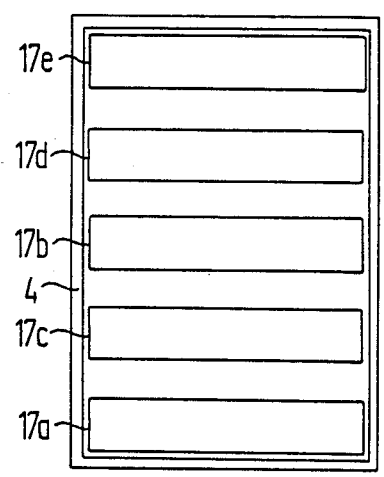

FIG. 20 illustrates a plan view of the structure of the transistor pair of FIG. 16.

Figure 21:
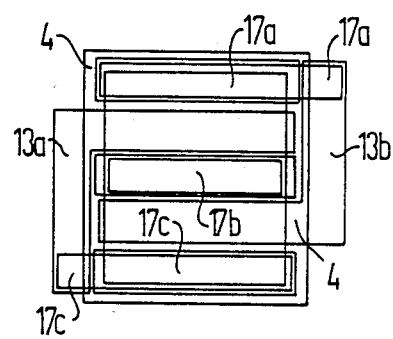

In FIG. 21 there is illustrated a plan view of the memory cell structure of FIG. 17. Contacts 17a and 17c produce the necessary connections from the base zones to the corresponding collectors, these contacts proceeding beyond the collector up to a point above the base terminals and thus produce a cross-wise connection of the bases to the collectors of FIG. 22. Two base contacts are thereby rendered unnecessary.

Figure 22:
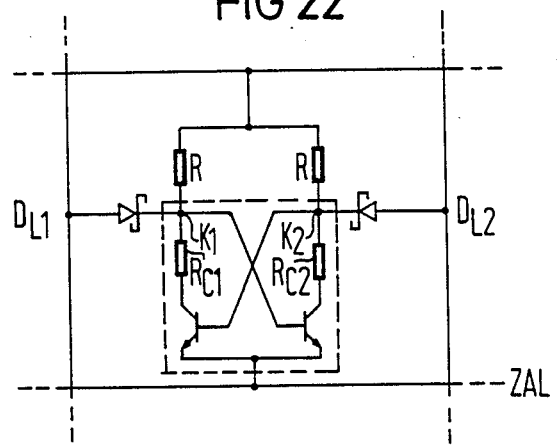
FIGS. 22 shows the circuit diagram of a memory cell.

FIG. 22 illustrates the circuit diagram of a memory cell comprising a Schottky-diode coupling, whereby the area with the dashed lines is manufactured on the basis of the method of the invention. $R_{c1}$ and $R_{c2}$ are automatically produced in the manufacture of the collector terminals. The nodes $K_1$ and $K_2$ are produced due to overlap of the collector contact 17a or 17c with corresponding base terminals. The reference numerals $DL_1$ and $DL_2$ are referred to the data line while ZAL refers to the row selection line.

Of course, base and collector regions in all of the cited instances can be manufactured by "aligned" methods if this should become necessary for some reason.

The principal advantages of the transistor structures of the invention as described and the manufacturing sequenced applied thereto are:

1. Reproducible emitter widths below 1 micron, particularly below 0.3 micron, can be obtained.

2. The manufacture is independent of the lithography, thus decreasing the cost.

3. The drastic reduction of parasitic elements yields ultra-high switching speeds.

4. Symmetrical transistor pairs having coupled emitters can be produced having an extremely low space requirement.

5. Memory cells having a minimal surface requirement can be manufactured.

6. The emitter-base region sensitive to crystal faults does not come into contact with an insulating region between the various components. As a result, a greater yield advantage is established and the structures are suitable for highly complex, very large-scale integrated circuits.

7. No complicated processing steps involving masks are required.

It should be evident that various modifications can be made to the described embodiments without departing from the scope of the present invention.

We claim as our invention:

1. A method for the manufacture of a very high speed bipolar transistor which comprises:
   (a) depositing an epitaxial layer of the second conductivity type on a silicon substrate of the first conductivity type;
   (b) generating isolating regions of a dielectric material within said epitaxial layer and in said silicon substrate to separate active transistor regions in said substrate;
   (c) implanting ions of said first conductivity type into said epitaxial layer of said second conductivity type;
   (d) sequentially depositing on said substrate a layered structure composed of a layer of insulating material, a layer of conductive material of the second conductivity type and a second layer of insulating material;
   (e) selectively anisotropically etching said layer structure such that said layer structure covers the portion of said substrate over which an emitter terminal is to be formed;
   (f) depositing a layer of conductive material of the second conductivity type over at least the edges of said layer structure in a thickness corresponding to the width of the emitter to be formed therein;

(g) anisotropically etching said last named layer to produce sidewall etching residues at the edges of said layer structure;

(h) applying a surface-wide insulating layer over the substrate;

(i) re-etching the surface-wide insulating layer to produce sidewall insulating layers at said etching residues;

(j) depositing a double layer of conductive material of the first conductivity type and an insulating layer over the resulting surface;

(k) anisotropically etching said double layer to define a base terminal;

(l) depositing and re-etching an insulating layer to produce sidewall insulating layers at said base terminal;

(m) depositing a conductive material of the second conductivity type and structuring the same to form emitter and collector terminals;

(n) subjecting the resulting structure to a high temperature treatment to activate the emitter diffusion zone and the base diffusion zone in said substrate;

(o) applying an intermediate oxide layer over the resulting structure; and (p) applying metallic terminal electrodes to the emitter, base and collector terminals.

2. A method according to claim 1, including the steps of generating buried zones which are to serve as collector terminals before step (a) by implantation of a dopant of the second conductivity type, and implanting dopant of said second conductivity type to form a low impedance connection prior to step (c).

3. A method according to claim 1, which includes a step of applying an insulating layer of silicon nitride over the layers applied in step (d) and removing said insulating layer of silicon nitride prior to step (h).

4. A method according to claim 1, wherein said isolating regions of step (h) are produced by trench etching and filling the resulting trenches with dielectric material.

5. A method according to claim 4, which includes a step of implanting ions of the first conductivity type in said trenches.

6. A method according to claim 1, wherein the insulating layers of step (d) and steps (h), (j) and (l) are all composed of a silicon oxide.

7. A method according to claim 1, wherein the conductive materials of steps (d), (f), (j), and (m) are selected from the following group: a refractory metal silicide, a dual layer of polysilicon and a refracting metal silicide, and a refractory metal.

8. A method according to claim 1, wherein the named etching processes are dry etching processes of the reactive ion etching type.

9. A method according to claim 1, wherein said high temperature treatment of step (n) is carried out at a temperature of 900° C. to 1000° C. for about 30 minutes.

10. A method according to claim 1, wherein the application of said surface-wide insulating layer of step (g) is carried out by selective thermal surface oxidation.

11. A method according to claim 1, wherein said emitter terminal is laterally contacted outwardly from said substrate and said base terminal is upwardly contacted from said substrate.

12. A method according to claim 1, wherein step (n) is carried out before method step (m).

* * * * *